(12) United States Patent
Fujikata

(10) Patent No.: US 12,069,429 B2
(45) Date of Patent: Aug. 20, 2024

(54) PIEZOELECTRIC FILM

(71) Applicant: FUJIFILM Corporation, Tokyo (JP)

(72) Inventor: Shingo Fujikata, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 148 days.

(21) Appl. No.: 17/843,354

(22) Filed: Jun. 17, 2022

(65) Prior Publication Data

US 2022/0329950 A1 Oct. 13, 2022

Related U.S. Application Data

(63) Continuation of application No. PCT/JP2020/042164, filed on Nov. 12, 2020.

(30) Foreign Application Priority Data

Dec. 18, 2019 (JP) ................. 2019-228384

(51) Int. Cl.
*H04R 17/00* (2006.01)
*H10N 30/85* (2023.01)

(52) U.S. Cl.
CPC .......... *H04R 17/005* (2013.01); *H10N 30/852* (2023.02)

(58) Field of Classification Search
CPC ........ H04R 17/005; H04R 17/00; H04R 7/10; H04R 31/003; H04R 1/1008; H04R 7/045; H04R 7/125; H04R 17/025; H04R 2307/025; B06B 1/0629; H10K 59/40; H10N 30/02; H10N 30/045; H10N 30/20;
(Continued)

(56) References Cited

U.S. PATENT DOCUMENTS 7,130,436 B1 * 10/2006 Tabata ................. H04R 1/1008
310/327
11,793,078 B2 * 10/2023 Miyoshi ............... H10N 30/045
381/190
(Continued)

FOREIGN PATENT DOCUMENTS

| JP | 2003-347616 A | 12/2003 |
| JP | 2005-50830 A | 2/2005 |

(Continued)

OTHER PUBLICATIONS

Extended European Search Report for corresponding European Application No. 20902808.3, dated May 8, 2023.
(Continued)

*Primary Examiner* — Gerald Gauthier
(74) *Attorney, Agent, or Firm* — Birch, Stewart, Kolasch & Birch, LLP

(57) ABSTRACT

An object of the present invention is to provide a cut sheet-like piezoelectric film which includes electrode layers on both surfaces of a piezoelectric layer and is capable of preventing a short circuit of the electrode layers. The object is achieved by providing a cut sheet-like piezoelectric film including a piezoelectric layer which contains piezoelectric particles in a matrix containing a polymer material, and electrode layers which are provided on both surfaces of the piezoelectric layer, in which a distance between the electrode layers at an end portion in a thickness direction is 40% or greater with respect to a thickness of the piezoelectric layer.

8 Claims, 4 Drawing Sheets

(58) Field of Classification Search
CPC .... H10N 30/40; H10N 30/852; H10N 30/857; H10N 30/87; H10N 30/872; H10N 30/874; H10N 30/883
See application file for complete search history.

(56) References Cited

U.S. PATENT DOCUMENTS

| | | | | |
|---|---|---|---|---|
| 2004/0007947 | A1* | 1/2004 | Takahashi | H10N 30/2047 310/363 |
| 2007/0242842 | A1* | 10/2007 | Kim | H04R 7/045 381/190 |
| 2008/0317266 | A1* | 12/2008 | Youn | H04R 17/005 381/190 |
| 2010/0054505 | A1* | 3/2010 | Zou | H04R 17/00 381/190 |
| 2011/0109204 | A1* | 5/2011 | Tajitsu | H04R 17/005 310/363 |
| 2014/0210309 | A1* | 7/2014 | Miyoshi | H04R 17/005 310/313 A |
| 2017/0373243 | A1 | 12/2017 | Ozawa et al. | |
| 2018/0014096 | A1 | 1/2018 | Miyoshi | |
| 2018/0160248 | A1 | 6/2018 | Murakami et al. | |
| 2018/0316995 | A1 | 11/2018 | Miyoshi | |
| 2020/0171542 | A1* | 6/2020 | Kho | B06B 1/0629 |
| 2020/0209973 | A1* | 7/2020 | Kim | H10K 59/40 |
| 2022/0109096 | A1* | 4/2022 | Tamada | H10N 30/874 |
| 2022/0109098 | A1* | 4/2022 | Fujikata | H04R 17/00 |
| 2022/0115582 | A1* | 4/2022 | Tsuruoka | H10N 30/872 |
| 2022/0238787 | A1* | 7/2022 | Kagawa | H10N 30/02 |
| 2022/0279283 | A1* | 9/2022 | Kagawa | H04R 17/005 |
| 2022/0329950 | A1* | 10/2022 | Fujikata | H10N 30/87 |
| 2022/0384706 | A1* | 12/2022 | Tamada | H04R 17/005 |

FOREIGN PATENT DOCUMENTS

| | | |
|---|---|---|
| KR | 10-2014-0068121 A | 6/2014 |
| WO | WO 2017/018313 A1 | 2/2017 |
| WO | WO 2017/126257 A1 | 7/2017 |

OTHER PUBLICATIONS

International Preliminary Report on Patentability dated Jun. 30, 2022, and English translation of the Written Opinion of the International Searching Authority for International Application No. PCT/JP2020/042164, dated Jan. 19, 2021.
International Search Report for International Application No. PCT/JP2020/042164, dated Jan. 19, 2021, with English translation.
Japanese Office Action for corresponding Japanese Application No. 2021-565370, dated Jul. 4, 2023, with English translation.
Korean Office Action for corresponding Korean Application No. 10-2022-7019571, dated Apr. 12, 2024, with English translation.

* cited by examiner

PIEZOELECTRIC FILM

CROSS-REFERENCE TO RELATED APPLICATIONS

This application is a Continuation of PCT International Application No. PCT/JP2020/042164 filed on Nov. 12, 2020, which claims priority under 35 U.S.C. § 119(a) to Japanese Patent Application No. 2019-228384 filed on Dec. 18, 2019. The above application is hereby expressly incorporated by reference, in its entirety, into the present application.

BACKGROUND OF THE INVENTION

1. Field of the Invention

The present invention relates to a piezoelectric film used for an electroacoustic converter or the like.

2. Description of the Related Art

With reduction in thickness and weight of displays such as liquid crystal displays or organic electroluminescence (EL) displays, speakers used in these thin displays are also required to be thinner and lighter. Further, with the development of flexible displays formed of flexible substrates such as plastics, speakers used in the flexible displays are also required to be flexible.

Examples of typical shapes of speakers of the related art include a funnel-like so-called cone shape and a spherical dome shape. However, in a case where such a speaker is intended to be incorporated in the above-described thin display, there is a concern that the lightness and the flexibility of the speaker are impaired because the speaker cannot be sufficiently made thin. Further, in a case where the speaker is attached externally, it is troublesome to carry the speaker.

Therefore, as a speaker that is thin and can be integrated into a thin display or a flexible display without impairing lightness and flexibility, a sheet-like piezoelectric film having flexibility and a property of stretching and contracting in response to an applied voltage has been suggested.

For example, the applicant suggested a piezoelectric film (electroacoustic conversion film) disclosed in WO2017/018313A as a sheet-like piezoelectric film that has flexibility and can stably reproduce a high-quality sound.

The piezoelectric film disclosed in WO2017/018313A includes a polymer-based piezoelectric composite material (piezoelectric layer) obtained by dispersing piezoelectric particles in a viscoelastic matrix consisting of a polymer material having a viscoelasticity at room temperature, an electrode layer formed on each of both surfaces of the polymer-based piezoelectric composite material, and a protective layer formed on a surface of the electrode layer. Further, in the piezoelectric film disclosed in WO2017/018313A, an intensity ratio al of a (002) plane peak intensity and a (200) plane peak intensity derived from the piezoelectric particles ((002) plane peak intensity/((002) plane peak intensity+(200) plane peak intensity)) in a case where the polymer-based piezoelectric composite material is evaluated by an X-ray diffraction method is 0.6 or greater and less than 1.

SUMMARY OF THE INVENTION

Such a piezoelectric film functions as a piezoelectric speaker by, for example, being maintained in a bent state. That is, by maintaining the piezoelectric film in a bent state and applying a driving voltage to the electrode layer, the polymer-based piezoelectric composite material stretches and contracts due to the stretch and contraction of the piezoelectric particles and the piezoelectric film vibrates to absorb the stretch and contraction. The piezoelectric film vibrates the air through this vibration and converts an electric signal into a sound.

The piezoelectric film has a configuration in which electrode layers are provided on both surfaces of the piezoelectric layer and protective layers are provided on both surfaces of thereof. In such a piezoelectric film, the piezoelectric layer has a thickness of, for example, preferably 300 µm or less, which is extremely thin. Further, the piezoelectric film is cut into a desired shape and used as a cut sheet in many cases.

Therefore, since the electrodes on both surfaces of the piezoelectric layer are likely to be short-circuited at an end portion (cut surface) of the piezoelectric film, the piezoelectric film does not operate properly in some cases.

An object of the present invention is to solve such a problem of the related art and to provide a cut sheet-like piezoelectric film which includes electrode layers on both surfaces of a piezoelectric layer containing piezoelectric particles in a matrix containing a polymer material and which is capable of preventing operation failure due to a short circuit of the electrode layers at an end portion of the piezoelectric film.

In order to solve the above-described problem, the present invention has the following configurations.

[1] A cut sheet-like piezoelectric film comprising: a piezoelectric layer which contains piezoelectric particles in a matrix containing a polymer material; and electrode layers which are provided on both surfaces of the piezoelectric layer, in which a distance between the electrode layers at an end portion in a thickness direction is 40% or greater with respect to a thickness of the piezoelectric layer.

[2] The piezoelectric film according to [1], further comprising: a protective layer which covers at least one electrode layer.

[3] The piezoelectric film according to [1] or [2], in which the distance between the electrode layers at the end portion in the thickness direction is 95% or less with respect to the thickness of the piezoelectric layer.

[4] The piezoelectric film according to any one of [1] to [3], in which the polymer material contains a cyanoethyl group.

[5] The piezoelectric film according to [4], in which the polymer material is cyanoethylated polyvinyl alcohol.

According to the present invention, it is possible to provide a cut sheet-like piezoelectric film which includes electrode layers and protective layers on both surfaces of a piezoelectric layer containing piezoelectric particles in a matrix containing a polymer material and which is capable of preventing a short circuit of the electrode layers at an end portion.

DESCRIPTION OF THE PREFERRED EMBODIMENTS

Figure 1:
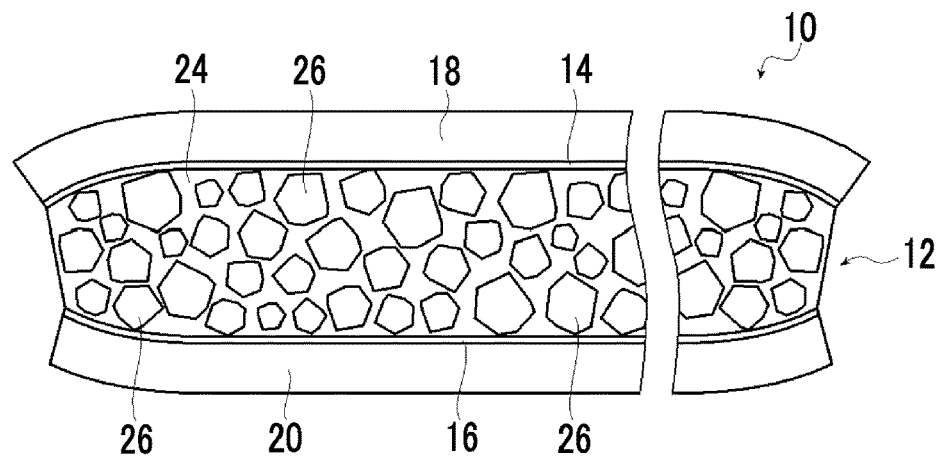
FIG. 1 is a cross-sectional view conceptually illustrating an example of a piezoelectric film according to the embodiment of the present invention.

Hereinafter, the piezoelectric film according to the embodiment of the present invention will be described in detail based on the preferred embodiments shown in the accompanying drawings.

Descriptions of the configuration requirements described below may be made based on representative embodiments of the present invention, but the present invention is not limited to such embodiments. In addition, the drawings shown below are conceptual views for describing the present invention, and the thickness of each layer, the size of constituent members, the positional relationship between constituent members, and the like are different from the actual values.

In the present specification, a numerical range shown using "to" indicates a range including numerical values described before and after "to" as a lower limit and an upper limit.

A piezoelectric film according to the embodiment of the present invention includes a piezoelectric layer which contains piezoelectric particles in a matrix containing a polymer material, and electrode layers which are provided on both surfaces of the piezoelectric layer. Further, the distance between the electrodes at an end portion in a thickness direction is 40% or greater with respect to a thickness of the piezoelectric layer.

The piezoelectric film according to the embodiment of the present invention further includes a protective layer that covers preferably one electrode layer and more preferably both electrode layers.

The piezoelectric film according to the embodiment of the present invention is used, for example, as an electroacoustic conversion film. Specifically, the piezoelectric film according to the embodiment of the present invention is used as a vibration plate of an electroacoustic converter such as a piezoelectric speaker, a microphone, or a voice sensor.

In an electroacoustic converter, in a case where the piezoelectric film is stretched in the in-plane direction due to application of a voltage to the piezoelectric film, the piezoelectric film moves upward (in the radiation direction of the sound) in order to absorb the stretched part. On the contrary, in a case where the piezoelectric film is contracted in the in-plane direction due to application of a voltage to the piezoelectric film, the piezoelectric film moves downward in order to absorb the contracted part.

The electroacoustic converter converts vibration (sound) and an electric signal using vibration caused by repeated stretch and contraction of the piezoelectric film and is used to input an electric signal to the piezoelectric film to reproduce a sound due to the vibration in response to the electric signal, convert the vibration of the piezoelectric film to an electric signal by receiving a sound wave, and apply tactile sensation or transport an object through the vibration.

Specific examples of the applications of the piezoelectric film include various acoustic devices, for example, speakers such as full-range speakers, tweeters, squawkers, and woofers, speakers for headphones, noise cancellers, microphones, and pickups (sensors for musical instruments) used for musical instruments such as guitars. Further, the piezoelectric film according to the embodiment of the present invention is a non-magnetic material, and thus can be suitably used as a noise canceller for MRI among noise cancellers.

Further, the electroacoustic converter formed of the piezoelectric film according to the embodiment of the present invention is thin, light, and bendable, and thus can be suitably used as wearable products such as hats, mufflers, and clothes, thin displays such as televisions and digital signage, buildings having a function as an acoustic device, ceilings of automobiles, curtains, umbrellas, wallpaper, windows, beds, and the like.

FIG. 1 conceptually illustrates an example of the piezoelectric film according to the embodiment of the present invention.

A piezoelectric film 10 illustrated in FIG. 1 includes a piezoelectric layer 12, a first electrode layer 14 laminated on one surface of the piezoelectric layer 12, a first protective layer 18 laminated on the first electrode layer 14, a second electrode layer 16 laminated on the other surface of the piezoelectric layer 12, and a second protective layer 20 laminated on the second electrode layer 16.

The piezoelectric film 10 according to the embodiment of the present invention is, for example, a long piezoelectric film prepared by roll-to-roll or a cut sheet-like (sheet paper-like) film cut into a desired shape from a large-sized piezoelectric film. Therefore, an end surface of the piezoelectric film 10 is a cut surface.

In the piezoelectric film 10 according to the embodiment of the present invention, the piezoelectric layer 12 is a polymer-based piezoelectric composite material layer that contains piezoelectric particles 26 in a matrix 24 containing a polymer material.

Here, it is preferable that the polymer-based piezoelectric composite material (piezoelectric layer 12) satisfies the following requirements. Further, in the present invention, room temperature is in a range of 0° C. to 50° C.

(i) Flexibility

For example, in a case of being gripped in a state of being loosely bent like a document such as a newspaper or a magazine as a portable device, the piezoelectric film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a polymer matrix and piezoelectric particles, which may lead to breakage. Accordingly, the polymer-based piezoelectric composite material is required to have suitable flexibility. In addition, in a case where strain energy is diffused into the outside as heat, the stress is able to be relieved. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and the vibration energy causes the entire vibration plate (polymer-based piezoelectric composite material) to vibrate integrally so that a sound is reproduced. Therefore, in order to increase the transmission efficiency of the vibration energy, the polymer-based piezoelectric composite material is required to have appropriate hardness. In addition, in a case where the frequency characteristic of the speaker is smooth, an amount of change in acoustic quality in a case where the lowest resonance frequency $f_0$ is changed in association with a change in the curvature of the speaker decreases. Therefore, the loss tangent of the polymer-based piezoelectric composite material is required to be suitably large.

It is known that the lowest resonance frequency $f_0$ of the vibration plate for a speaker is represented by the following equation. Here, s represents the stiffness of the vibration system and m represents the mass.

$$\text{Lowest resonance frequency:} f_0 = \frac{1}{2\pi}\sqrt{\frac{s}{m}}$$

Here, as the degree of curvature of the piezoelectric film, that is, the curvature radius of the curved portion increases, the mechanical stiffness s decreases, and thus the lowest resonance frequency $f_0$ decreases. That is, the acoustic quality (the volume and the frequency characteristics) of the speaker changes depending on the curvature radius of the piezoelectric film.

That is, the polymer-based piezoelectric composite material is required to exhibit a behavior of being hard with respect to a vibration of 20 Hz to 20 kHz and being flexible with respect to a vibration of less than or equal to a few Hz. In addition, the loss tangent of a polymer-based piezoelectric composite material is required to be suitably large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among these, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (piezoelectric layer 12), the polymer-based piezoelectric composite material exhibiting a behavior of being hard with respect to a vibration of 20 Hz to 20 kHz and being flexible with respect to a vibration of less than or equal to a few Hz is realized by using a polymer material whose glass transition point is room temperature, that is, a polymer material having a viscoelasticity at room temperature as a matrix. In particular, from the viewpoint that such a behavior is suitably exhibited, it is preferable that the polymer material in which the glass transition point Tg at a frequency of 1 Hz is at room temperature is used for a matrix of the polymer-based piezoelectric composite material.

In the polymer material constituting the matrix 24, it is preferable that the maximal value of a loss tangent tan δ at a frequency of 1 Hz according to a dynamic viscoelasticity test at room temperature is 0.5 or greater.

In this manner, in a case where the polymer-based piezoelectric composite material is slowly bent due to an external force, stress concentration on the interface between the polymer matrix and the piezoelectric particles at the maximum bending moment portion is relieved, and thus satisfactory flexibility can be expected.

In the polymer material constituting the matrix 24, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being hard with respect to an acoustic vibration of 20 Hz to 20 kHz.

In addition, it is more suitable that the relative dielectric constant of the polymer material constituting the matrix 24 is 10 or greater at 25° C. Accordingly, in a case where a voltage is applied to the polymer-based piezoelectric composite material, a higher electric field is applied to the piezoelectric particles in the polymer matrix, and thus a large deformation amount can be expected.

However, in consideration of ensuring satisfactory moisture resistance and the like, it is suitable that the relative dielectric constant of the polymer material is 10 or less at 25° C.

Suitable examples of the polymer material that satisfies such conditions include cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, and polybutyl methacrylate.

In addition, as these polymer materials, a commercially available product such as Hybrar 5127 (manufactured by Kuraray Co., Ltd.) can also be suitably used.

It is preferable to use a polymer material containing a cyanoethyl group and particularly preferable to use cyanoethylated PVA as the polymer material constituting the matrix 24. That is, in the piezoelectric film 10 according to the embodiment of the present invention, it is preferable to use a polymer material containing a cyanoethyl group and particularly preferable to use cyanoethylated PVA as the matrix 24 of the piezoelectric layer 12.

In the description below, the above-described polymer materials typified by cyanoethylated PVA will also be collectively referred to as the "polymer material having a viscoelasticity at room temperature".

Further, the polymer material having a viscoelasticity at room temperature may be used alone or in combination (mixture) of two or more kinds thereof.

In the piezoelectric film 10 according to the embodiment of the present invention, a plurality of polymer materials may be used in combination as necessary for the matrix 24 of the piezoelectric layer 12.

That is, for the purpose of adjusting dielectric characteristics, mechanical characteristics, and the like, other dielectric polymer materials may be added to the matrix 24 constituting the polymer-based piezoelectric composite material in addition to the polymer material having a viscoelasticity at room temperature as necessary.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

Further, in the matrix 24 of the piezoelectric layer 12, the number of these dielectric polymer materials is not limited to one, and a plurality of kinds of dielectric polymer materials may be added.

In addition, for the purpose of adjusting the glass transition point Tg of the matrix 24, the matrix 24 may contain a thermoplastic resin such as a vinyl chloride resin, polyethylene, polystyrene, a methacrylic resin, polybutene, or isobutylene, and a thermosetting resin such as a phenol resin, a urea resin, a melamine resin, an alkyd resin, or mica in addition to the dielectric polymer materials.

Further, for the purpose of improving the pressure sensitive adhesiveness, a viscosity imparting agent such as rosin ester, rosin, terpene, terpene phenol, or a petroleum resin may be added.

In the matrix 24 of the piezoelectric layer 12, the addition amount in a case of adding polymer materials other than the polymer material having a viscoelasticity at room temperature is not particularly limited, but is preferably set to 30% by mass or less in terms of the proportion of the polymer materials in the matrix 24.

In this manner, the characteristics of the polymer material to be added can be exhibited without impairing the viscoelasticity relieving mechanism in the matrix 24, and thus preferable results, for example, an increase in the dielectric constant, improvement of the heat resistantance, and improvement of the adhesiveness between the piezoelectric particles 26 and the electrode layer can be obtained.

The polymer-based piezoelectric composite material which is the piezoelectric layer 12 contains the piezoelectric particles 26 in the polymer matrix. The piezoelectric particles 26 are dispersed in the polymer matrix. It is preferable that the piezoelectric particles 26 are dispersed uniformly (substantially uniform) in the polymer matrix.

It is preferable that the piezoelectric particles 26 consist of ceramic particles having a perovskite type or wurtzite type crystal structure.

Examples of the ceramic particles constituting the piezoelectric particles 26 include lead zirconate titanate (PZT), lead lanthanum zirconate titanate (PLZT), barium titanate (BaTiO$_3$), zinc oxide (ZnO), and a solid solution (BFBT) of barium titanate and bismuth ferrite (BiFe$_3$).

The particle diameter of the piezoelectric particles 26 may be appropriately selected according to the size of the piezoelectric film 10 and the applications of the piezoelectric film 10. The particle diameter of the piezoelectric particles 26 is preferably in a range of 1 to 10 m.

By setting the particle diameter of the piezoelectric particles 26 to be in the above-described range, preferable results in terms of achieving both excellent piezoelectric characteristics and flexibility can be obtained.

In the piezoelectric film 10, the ratio between the amount of the matrix 24 and the amount of the piezoelectric particles 26 in the piezoelectric layer 12 may be appropriately set according to the size of the piezoelectric film 10 in the plane direction, the thickness of the piezoelectric film 10, the applications of the piezoelectric film 10, the characteristics required for the piezoelectric film 10, and the like.

The volume fraction of the piezoelectric particles 26 in the piezoelectric layer 12 is preferably in a range of 30% to 80% and more preferably in a range of 50% to 80%.

By setting the ratio between the amount of the matrix 24 and the amount of the piezoelectric particles 26 to be in the above-described range, preferable results in terms of achieving both excellent piezoelectric characteristics and flexibility can be obtained.

In the piezoelectric film 10, the thickness of the piezoelectric layer 12 is not limited and may be appropriately set according to the size of the piezoelectric film 10, the applications of the piezoelectric film 10, the characteristics required for the piezoelectric film 10, and the like.

The thickness of the piezoelectric layer 12 is preferably in a range of 8 to 300 μm, more preferably in a range of 8 to 200 μm, still more preferably in a range of 10 to 150 μm, and particularly preferably in a range of 15 to 100 μm.

By setting the thickness of the piezoelectric layer 12 to be in the above-described range, preferable results in terms of achieving both ensuring of the rigidity and moderate softness can be obtained.

It is preferable that the piezoelectric layer 12 is subjected to a polarization treatment (poling) in the thickness direction. The polarization treatment will be described in detail later.

Metal impurities may be mixed into the piezoelectric layer 12.

For example, the piezoelectric layer 12 is formed by using a paint for forming the piezoelectric layer 12, as described below. The paint is prepared by adding the polymer material constituting the matrix 24 and the piezoelectric particles 26 to an organic solvent and stirring the mixture. In a case of stirring the mixture during the preparation of the paint, the metal propeller that is used to stir the mixture may be damaged and mixed into the paint, and is thus mixed into the piezoelectric layer 12 as metal impurities in some cases.

In a case where such metal impurities are mixed into the piezoelectric layer 12, the first electrode layer 14 and the second electrode layer 16 are short-circuited due to the metal impurities, and the piezoelectric film 10 does not operate properly in some cases.

Therefore, it is preferable that the amount of such metal impurities in the piezoelectric layer 12 is small. Specifically, the amount of metal impurities in the piezoelectric layer 12 is preferably 200 ppm or less, more preferably 100 ppm or less, and still more preferably zero.

Further, the amount of metal impurities in the piezoelectric layer 12 may be measured by inductively coupled plasma (ICP) analysis after the piezoelectric layer 12 is treated with a strong acid or the like for incineration. Examples of the metal to be detected include Li, B, Na, Mg, Al, K, Ca, Cr, Mn, Fe, Co, Ni, Cu, Zn, Ga, Sr, In, Ba, Tl, and Bi. In a case where the amount of such metals is in the preferable range, a short circuit can be suppressed.

The laminated film of the piezoelectric film 10 illustrated in FIG. 1 has a configuration in which the second electrode layer 16 is provided on one surface of the piezoelectric layer 12, the second protective layer 20 is provided on the surface of the second electrode layer 16, the first electrode layer 14 is provided on the other surface of the piezoelectric layer 12, and the first protective layer 18 is provided on the surface of the first electrode layer 14. In the piezoelectric film 10, the first electrode layer 14 and the second electrode layer 16 form an electrode pair.

That is, the laminated film constituting the piezoelectric film 10 according to the embodiment of the present invention has a configuration in which both surfaces of the piezoelectric layer 12 are sandwiched between the electrode pair, that is, the first electrode layer 14 and the second electrode layer 16 and further sandwiched between the first protective layer 18 and the second protective layer 20.

In this manner, the region where the both surfaces are sandwiched between the first electrode layer 14 and the second electrode layer 16 is driven according to the applied voltage.

In the present invention, the terms "first" and "second" in the first electrode layer 14 and the second electrode layer 16 are denoted for convenience to describe the piezoelectric film 10 according to the embodiment of the present invention.

Therefore, the terms "first" and "second" in the piezoelectric film 10 according to the embodiment of the present invention have no technical meaning and are irrelevant to the actual use state.

The piezoelectric film 10 according to the embodiment of the present invention may include, for example, a bonding layer for bonding the electrode layer and the piezoelectric layer 12 to each other and a bonding layer for bonding the electrode layer and the protective layer to each other, in addition to the above-described layers.

The bonding agent may be an adhesive or a pressure sensitive adhesive. Further, the same material as the polymer material obtained by removing the piezoelectric particles 26 from the piezoelectric layer 12, that is, the matrix 24 can also be suitably used as the bonding agent. Further, the bonding layer may be provided on both the first electrode layer 14 side and the second electrode layer 16 side or may be provided only on one of the first electrode layer 14 side or the second electrode layer 16 side.

The first protective layer 18 and the second protective layer 20 in the piezoelectric film 10 have a function of coating the first electrode layer 14 and the second electrode layer 16 and applying moderate rigidity and mechanical strength to the piezoelectric layer 12. That is, in the piezoelectric film 10 according to the embodiment of the present invention, the piezoelectric layer 12 containing the matrix 24 and the piezoelectric particles 26 exhibits extremely excellent flexibility under bending deformation at a slow vibration, but may have insufficient rigidity or mechanical strength depending on the applications. As a compensation for this, the piezoelectric film 10 is provided with the first protective layer 18 and the second protective layer 20.

The first protective layer 18 and the second protective layer 20 have an identical configuration except for the disposition position. Therefore, in the description below, in a case where it is not necessary to distinguish the first protective layer 18 from the second protective layer 20, both members are collectively referred to as a protective layer.

The protective layer is not limited, and various sheet-like materials can be used as the protective layer, and suitable examples thereof include various resin films. Among these, from the viewpoints of excellent mechanical characteristics and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyamide (PA), polyethylene naphthalate (PEN), triacetyl cellulose (TAC), and a cyclic olefin-based resin is suitably used.

The thickness of the protective layer is not limited. In addition, the thicknesses of the first protective layer 18 and the second protective layer 20 are basically the same as each other, but may be different from each other.

Here, in a case where the rigidity of the protective layer is extremely high, not only is the stretch and contraction of the piezoelectric layer 12 constrained, but also the flexibility is impaired. Therefore, it is advantageous that the thickness of the protective layer decrease except for the case where the mechanical strength and satisfactory handleability as a sheet-like material are required.

In a case where the thickness of the first protective layer 18 and the thickness of the second protective layer 20 are respectively two times or less the thickness of the piezoelectric layer 12, preferable results in terms of ensuring of the rigidity and achieving moderate softness can be obtained.

For example, in a case where the thickness of the piezoelectric layer 12 is 50 µm and the first protective layer 18 and the second protective layer 20 consist of PET, the thickness of the first protective layer 18 and the thickness of the second protective layer 20 are respectively preferably 100 µm or less, more preferably 50 µm or less, and still more preferably 25 µm or less.

In the piezoelectric film according to the embodiment of the present invention, the protective layer is not an essential configuration requirement. Therefore, the piezoelectric film according to the embodiment of the present invention may not have any one or both of the first protective layer 18 and the second protective layer 20 at the same time.

However, in consideration of protection of the first electrode layer 14 and the second electrode layer 16, protection of the piezoelectric layer 12, and the handleability of the piezoelectric film, the piezoelectric film according to the embodiment of the present invention includes preferably the first protective layer 18 or the second protective layer 20 and more preferably both the first protective layer 18 and the second protective layer 20.

In the piezoelectric film 10 (laminated film), the first electrode layer 14 is formed between the piezoelectric layer 12 and the first protective layer 18, and the second electrode layer 16 is formed between the piezoelectric layer 12 and the second protective layer 20. The first electrode layer 14 and the second electrode layer 16 are provided to apply an electric field to the piezoelectric film 10 (piezoelectric layer 12).

The first electrode layer 14 and the second electrode layer 16 are basically the same as each other except that the positions are different from each other. Therefore, in the description below, in a case where it is not necessary to distinguish the first electrode layer 14 from the second electrode layer 16, both members are collectively referred to as an electrode layer.

In the piezoelectric film according to the embodiment of the present invention, the material for forming the electrode layer is not limited, and various conductors can be used as the material. Specific examples thereof include conductive polymers such as carbon, palladium, iron, tin, aluminum, nickel, platinum, gold, silver, copper, chromium, molybdenum, alloys thereof, indium tin oxide, and polyethylene dioxythiophene-polystyrene sulfonic acid (PEDOT/PPS).

Among these, copper, aluminum, gold, silver, platinum, and indium tin oxide are suitable. Among these, from the viewpoints of the conductivity, the cost, and the flexibility, copper is more preferable.

In addition, the method of forming the electrode layer is not limited, and various known methods, for example, a vapor-phase deposition method (a vacuum film forming method) such as vacuum vapor deposition or sputtering, a film forming method of using plating, a method of bonding a foil formed of the materials described above, and a coating method can be used.

Among these, particularly from the viewpoint of ensuring the flexibility of the piezoelectric film 10, a thin film made of copper or aluminum formed by vacuum vapor deposition is suitably used as the electrode layer. Among these, particularly a thin film made of copper formed by vacuum vapor deposition is suitably used.

The thicknesses of the first electrode layer 14 and the second electrode layer 16 are not limited. In addition, the thicknesses of the first electrode layer 14 and the second electrode layer 16 are basically the same as each other, but may be different from each other.

Here, similarly to the protective layer described above, in a case where the rigidity of the electrode layer is extremely high, not only is the stretch and contraction of the piezoelectric layer 12 constrained, but also the flexibility is impaired. Therefore, it is advantageous that the thickness of the electrode layer decreases in a range where the electric resistance is not excessively high.

It is suitable that the product of the thickness of the electrode layer of the piezoelectric film 10 according to the embodiment of the present invention and the Young's modulus thereof is less than the product of the thickness of the protective layer and the Young's modulus thereof because the flexibility is not considerably impaired.

For example, in a case of a combination consisting of the protective layer formed of PET (Young's modulus: approximately 6.2 GPa) and the electrode layer formed of copper (Young's modulus: approximately 130 GPa), the thickness of the electrode layer is preferably 1.2 μm or less, more preferably 0.3 μm or less, and still more preferably 0.1 μm or less in a case of assuming that the thickness of the protective layer is 25 μm.

The piezoelectric film 10 has a configuration in which the piezoelectric layer 12 is sandwiched between the first electrode layer 14 and the second electrode layer 16 and further sandwiched between the first protective layer 18 and the second protective layer 20.

It is preferable that, in such a piezoelectric film 10, the maximal value at which the loss tangent (tan δ) at a frequency of 1 Hz according to dynamic viscoelasticity measurement is 0.1 or greater is present at room temperature.

In this manner, even in a case where the piezoelectric film 10 is subjected to bending deformation at a relatively slow vibration of less than or equal to a few Hz from the outside, since the strain energy can be effectively diffused to the outside as heat, occurrence of cracks on the interface between the polymer matrix and the piezoelectric particles can be prevented.

In the piezoelectric film 10, it is preferable that the storage elastic modulus (E') at a frequency of 1 Hz according to the dynamic viscoelasticity measurement is 10 to 30 GPa at 0° C. and 1 to 10 GPa at 50° C.

In this manner, the piezoelectric film 10 may have large frequency dispersion in the storage elastic modulus (E') at room temperature. That is, the piezoelectric film 10 can exhibit a behavior of being hard with respect to a vibration of 20 Hz to 20 kHz and being flexible with respect to a vibration of less than or equal to a few Hz.

In the piezoelectric film 10, it is preferable that the product of the thickness and the storage elastic modulus (E') at a frequency of 1 Hz according to the dynamic viscoelasticity measurement is in a range of $1.0 \times 10^6$ to $2.0 \times 10^6$ N/m at 0° C. and in a range of $1.0 \times 10^5$ to $1.0 \times 10^6$ N/m at 50° C.

In this manner, the piezoelectric film 10 may have moderate rigidity and mechanical strength within a range not impairing the flexibility and the acoustic characteristics.

Further, in the piezoelectric film 10, it is preferable that the loss tangent (Tan δ) at a frequency of 1 kHz at 25° C. is 0.05 or greater in a master curve obtained from the dynamic viscoelasticity measurement.

In this manner, the frequency characteristic of a speaker using the piezoelectric film 10 is smooth, and thus an amount of change in acoustic quality in a case where the lowest resonance frequency $f_0$ is changed according to a change in the curvature of the speaker (piezoelectric film 10) can be decreased.

As described above, the piezoelectric film 10 according to the embodiment of the present invention is a long piezoelectric film prepared by roll-to-roll or a cut sheet-like film cut into a desired shape from a large-sized piezoelectric film. Therefore, the end surface is a cut surface.

Here, in the piezoelectric film 10 according to the embodiment of the present invention, a distance d between the first electrode layer 14 and the second electrode layer 16 at the end portion in the thickness direction is 40% or greater with respect to the thickness t of the piezoelectric layer 12. In other words, the thickness direction is a direction in which the piezoelectric layer 12, the first electrode layer 14 and the second electrode layer 16, and the first protective layer 18 and the second protective layer 20 are laminated.

In a case where the piezoelectric film 10 according to the embodiment of the present invention has such a configuration, a short circuit between the first electrode layer 14 and the second electrode layer 16 at the end portion can be suitably prevented.

In the piezoelectric film, it is important that the insulating properties of the electrode layers sandwiching the piezoelectric layer are sufficiently ensured as designed. In a case where the insulating properties are insufficient, a voltage greater than or equal to the designed value is applied to the power supply due to a short circuit between the electrodes during application of a voltage required for driving, the power supply is abnormally stopped due to defects (damage) or a protection circuit, and thus the driving is stopped.

In a case of the cut sheet-like piezoelectric film in which the piezoelectric layer is sandwiched between the electrode layers, most of the short circuits between the electrode layers occur at the end surface (cut surface) of the piezoelectric film.

That is, in a case where a cut sheet having a desired shape is cut from a large-sized sheet-like material, the sheet-like material is, for example, cut with a cutter blade and punched with a mold. In the cutting, a shear stress is applied to the cut portion of the cut sheet to be cut, and the sheet is cut during application of the yield stress.

Therefore, plastic deformation, so-called sagging, occurs due to the shear stress at the end portion (end surface/cut surface) of the piezoelectric film 10 according to the embodiment of the present invention, the first electrode layer 14 and the second electrode layer 16 are in close proximity to each other as conceptually illustrated in FIG. 1, and thus a short circuit is likely to occur.

The voltage at which discharge (spark) occurs between electrodes varies depending on the atmospheric conditions and the shape of the electrodes, but typically reaches several hundred volts in a case where the distance between the electrodes, for example, a flat plate electrode and a needle-shaped electrode is approximately 100 μm.

However, in a piezoelectric layer containing piezoelectric particles in the matrix containing a polymer material, that is, a piezoelectric film in which electrode layers are provided on both surfaces of a polymer-based piezoelectric composite material layer, actual discharge may occur at a voltage significantly lower than the voltage described above depending on the cutting conditions.

The present inventors have further conducted intensive examination on the phenomenon of a short circuit that is considered to occur due to a part of the reason described above. As a result, it is found that a short circuit of the cut sheet-like piezoelectric film occurs due to adhesion of the burrs of the electrode layers generated during cutting and debris (cutting debris) of the electrode layers generated during cutting to the cut surface, that is, the end surface of the piezoelectric film.

In a case where the piezoelectric film in which the piezoelectric layer is sandwiched between the electrode layers is cut, so-called burrs (whiskers) in which the electrode layers are partially led out due to the ductility of the metal. Further, the electrode layers are finely broken due to the cutting, and thus debris of the electrode layers is generated. The generation of burrs and debris cannot be avoided during the cutting.

For example, in a case of a typical piezoelectric film in which a piezoelectric material such as polyvinylidene fluoride (PVDF) is used as a piezoelectric layer, the influence of burrs and debris on the electrode layers is small. Therefore, a short circuit can be avoided by thickening the piezoelectric layer.

On the contrary, the polymer-based piezoelectric composite material layer contains the piezoelectric particles in the matrix containing a polymer material and is thus harder and more brittle than the piezoelectric layer made of PVDF or the like. Therefore, in the piezoelectric film in which the polymer-based piezoelectric composite material layer is sandwiched between the electrode layers, the load on the cutter blade and the punching mold during cutting is large and vibration is also likely to occur, and accordingly larger amounts of burrs and debris of the electrode layers are generated than those of a typical piezoelectric film.

Therefore, in the piezoelectric film in which the polymer-based piezoelectric composite material layer is sandwiched between the electrode layers, large amounts of burrs and debris of the electrode layers are adhered to the end surface. As a result, the distance between the electrodes on the end surface of the piezoelectric film is substantially extremely shorter than the actual distance between the electrode layers. Further, even in a case where the piezoelectric layer is made thicker, the cut length increases to that extent in a case of the polymer piezoelectric layer, and the amount of burrs and debris to be generated increases, which is not a solution. That is, a simple increase in the distance between the electrode layers in the piezoelectric film in which the polymer-based piezoelectric composite material layer is sandwiched between the electrode layers is not a solution of a short circuit.

As a result of intensive examination conducted by the present inventors, it was found that the amount of burrs and debris to be adhered to the end surface is correlated with the ratio between the distance between the electrode layers at the end portion (cut surface) after cutting in the thickness direction and the thickness of the polymer piezoelectric layer, in the piezoelectric film in which the polymer-based piezoelectric composite material layer is sandwiched between the electrode layers.

The amount of burrs and debris to be generated during cutting is related to the sharpness of the cutter blade or the like that performs cutting. That is, the amount of burrs and debris to be generated during cutting decreases as the sharpness of the cutter blade, the mold, or the like during cutting is better.

Meanwhile, the magnitude of plastic deformation at the end portion of the piezoelectric film due to cutting is related to the sharpness of the cutter blade or the like that performs cutting. In a case where the sharpness of the cutter blade or the like is satisfactory, the plastic deformation of the end portion is small. Therefore, a difference between the thickness of the piezoelectric layer and the distance between the electrode layers at the end portion decreases in a case where the sharpness of the cutter blade or the like is satisfactory.

That is, although the amount of burrs and debris to be actually adhered to the end surface is difficult to measure, the amount of burrs and debris to be adhered to the end surface is correlated with the ratio of the distance between the electrode layers at the end portion in the thickness direction to the thickness of the polymer piezoelectric layer, and therefore, the amount of burrs and debris to be adhered to the end surface decreases as the difference between the thickness of the polymer-based piezoelectric composite material layer and the distance between the electrode layers at the end portion in the thickness direction decreases.

According to the examination of the present inventor, even in a case where the amount of burrs and debris of the electrode layers to be adhered to the end surface is sufficiently decreased to reduce the thickness of the piezoelectric layer, the insulating properties required to prevent a short circuit of the electrode layers can be ensured by setting the distance between the electrode layers at the end portion of the piezoelectric film in the thickness direction to 40% or greater with respect to the thickness of the polymer-based piezoelectric composite material layer.

The present invention has been made by obtaining such knowledge. Based on the knowledge, the polymer-based piezoelectric composite material layer containing the piezoelectric particles in the matrix containing the polymer material is defined as the piezoelectric layer 12, and the distance between the first electrode layer 14 and the second electrode layer 16 at the end portion (cut portion) in the thickness direction is set to 40% or greater with respect to the thickness of the piezoelectric layer 12, in the cut sheet-like piezoelectric film 10 in which both surfaces of the piezoelectric layer 12 are sandwiched between the first electrode layer 14 and the second electrode layer 16.

In the following description, the distance between the first electrode layer 14 and the second electrode layer 16 at the end portion (cut portion) in the thickness direction is also referred to as "distance d", the thickness of the piezoelectric layer 12 is also referred to as "thickness t", and the ratio of the distance d to the thickness t is also referred to as "ratio p".

Since the piezoelectric film 10 according to the embodiment of the present invention has such a configuration, a short circuit between the first electrode layer 14 and the second electrode layer 16 at the end portion of the cut sheet-like piezoelectric film is prevented, and the piezoelectric film can stably operate property. Further, in the piezoelectric film 10 according to the embodiment of the present invention, production control can be properly performed by replacing the blade, adjusting the blade, polishing the blade, and performing maintenance on the blade in a case where the ratio p is less than 40%.

In a case where the ratio p is less than 40% in the piezoelectric film 10, sufficient insulating properties between the first electrode layer 14 and the second electrode layer 16 at the end portion cannot be ensured, and thus a short circuit is highly likely to occur.

The ratio p is preferably 50% or greater.

Further, the upper limit of the ratio p is not limited. However, plastic deformation due to the shear stress constantly occurs in a case where cutting is carried out. Therefore, the ratio p does not reach 100%.

In consideration of this point, the maximum ratio p is 95%.

In the present invention, the ratio p of the distance d between the first electrode layer 14 and the second electrode layer 16 at the end portion of the piezoelectric film 10 in the thickness direction to the thickness t of the piezoelectric layer 12 can be measured by various known methods.

Examples of the methods include a measuring method of observing the end surface of the piezoelectric film 10, that is, the end portion of the cut surface thereof using a scanning electron microscope (SEM) equipped with energy dispersive X-ray spectrometry ((EDS), an energy dispersive X-ray analyzer (EDX)) and performing elemental mapping on the material forming the electrode layers. Commercially available products may be used for a SEM and an EDX. Examples of the commercially available products include SU8220 (manufactured by Hitachi High-Tech Corporation) as a SEM and XFash 5060FQ (manufactured by Bruker Corporation) as an EDS.

Figure 2:
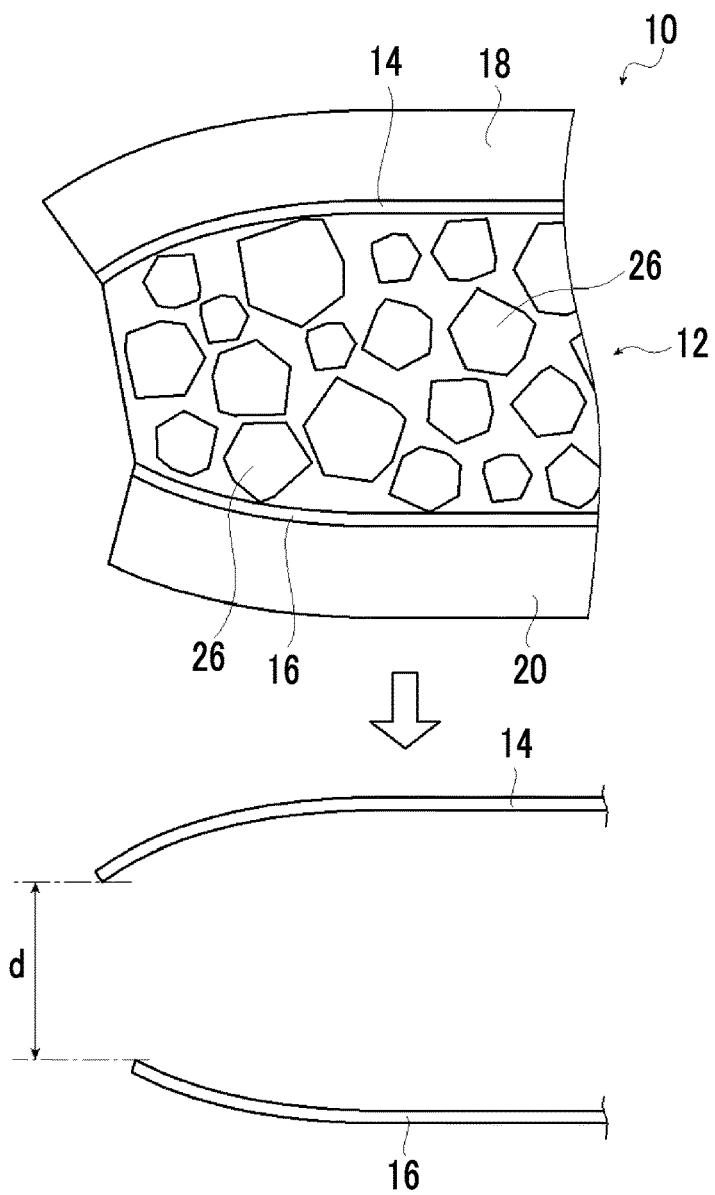
FIG. 2 is a conceptual view for describing a method of measuring the ratio of the distance between electrodes to the thickness of a piezoelectric layer in the piezoelectric film according to the embodiment of the present invention.

That is, as conceptually illustrated in the upper part of FIG. 2, the end portion of the end surface of the piezoelectric film 10 is observed by a SEM (SEM-EDS) equipped with an EDS, and the end surface of the observation region is subjected to elemental analysis using EDS.

Next, as shown in the results of the elemental analysis as conceptually illustrated in the lower part of FIG. 2, the forming material of the first electrode layer 14 and the second electrode layer 16 is subjected to elemental mapping to obtain an image of the mapping result. For example, in a case where the forming material of the first electrode layer 14 and the second electrode layer 16 is copper, copper mapping is performed based on the results of the elemental analysis to obtain an image of the copper mapping result.

After an image of the elemental mapping performed on the forming material of the electrode layers is obtained, the distance d between the first electrode layer 14 and the second electrode layer 16 at the end portion of the piezoelectric film 10 in the thickness direction is measured based on the image of the elemental mapping as illustrated in the lower part of FIG. 2.

Meanwhile, in a case where the thickness t of the piezoelectric layer 12 is known from the catalog value or the like of the piezoelectric film 10, the numerical value may be used.

Alternatively, the thickness t of the piezoelectric layer 12 may be measured by a known method at the time of formation of the piezoelectric layer 12 in the step of producing the piezoelectric film 10 (for example, the state of FIG. 5) described below. Alternatively, the thickness t of the piezoelectric layer 12 may be calculated from the coating thickness and the composition of the paint that forms the piezoelectric layer 12 in the step of producing the piezoelectric film 10 described below. Alternatively, the total thickness of the laminate is measured at the time of formation of the piezoelectric layer 12 (for example, the state of FIG. 5), the thickness of the laminate is measured after the piezoelectric layer 12 is partially removed, and the thickness t of the piezoelectric layer 12 may be acquired based on the difference between the measured thicknesses.

In a case where the thickness t of the piezoelectric layer 12 cannot be measured (known) by these methods, the thickness t of the piezoelectric layer 12 may be measured by the following method.

The piezoelectric film 10 is embedded in a resin. It is preferable that the piezoelectric film 10 is embedded in a resin from the cut surface thereof to a depth of 5 mm or greater. The resin used for embedding may be appropriately set according to the forming material and the size (the area of the maximum surface and the thickness) of the piezoelectric film 10. Further, the resin used for embedding may be used in a mixture of a plurality of kinds thereof as necessary.

After the piezoelectric film 10 is embedded in the resin, the piezoelectric film 10 embedded in the resin is cut in a straight line at an optional place. The piezoelectric film 10 may be cut by a known method such as a method of using a microtome or the like.

It is preferable that the cutting is performed at a position where the center of the cut surface in the longitudinal direction is positioned inside from all the end portions (end surfaces) of the piezoelectric film 10 to a depth of 5 mm or greater.

Next, the cut surface is polished as necessary. The cut surface may be polished by a known method.

Further, elemental mapping of the forming material of the first electrode layer 14 and the second electrode layer 16 using SEM-EDS described above is performed at the central portion of the cut surface in the longitudinal direction. Next, the distance between the inner surface of the first electrode layer 14 and the inner surface of the second electrode layer 16 in the thickness direction is measured at the center of the cut surface in the longitudinal direction based on the image of the elemental mapping, and the distance is defined as the thickness of the piezoelectric film on the cut surface. In this manner, the thickness t of the piezoelectric layer 12 can be measured on the cut surface of the piezoelectric film 10 without being affected by the above-described plastic deformation (sagging).

The thickness of the piezoelectric layer 12 on the cut surface is measured on optional five cross sections, and the average value thereof is defined as the thickness t of the piezoelectric layer 12 of the piezoelectric film 10 to be measured.

Further, the method of embedding the piezoelectric film 10 in a resin can also be used to measure the distance d between the first electrode layer 14 and the second electrode layer 16 in the thickness direction. That is, the piezoelectric film is embedded from the end portion to a depth of 5 mm or greater so as to include the measurement position for the distance d, the piezoelectric film is cut using a microtome and polished as necessary, and the distance d may be measured using SEM-EDS on each end surface (cut surface) of the cut sheet-like piezoelectric film 10.

The ratio p [%] of the distance d between the first electrode layer 14 and the second electrode layer 16 at the end portion of the piezoelectric film 10 in the thickness direction to the thickness t of the piezoelectric layer 12 is calculated by the following equation based on the measurement results of the thickness t and the distance d.

$$p[\%]=(d/t)\times 100$$

Here, for example, in a case where the cut sheet-like piezoelectric film 10 is rectangular, the piezoelectric film has four end surfaces (cut surfaces). Therefore, as conceptually illustrated in FIG. 3, the ratio p of one end portion of the side A observed by a SEM in the direction indicated the arrow a orthogonal to the side A and the ratio p of one end surface of the side B observed by a SEM in the direction indicated by the arrow b orthogonal to the side B can be measured for one corner.

That is, in a case where the piezoelectric film 10 is rectangular, the ratio p of the end portions of the piezoelectric film 10 at eight sites in total can be measured with respect to the corners at the four sites.

The piezoelectric film according to the embodiment of the present invention is not limited to the rectangle as described above, and various shapes can be used. Examples of the planar shape, that is, the shape of the main surface of the piezoelectric film according to the embodiment of the present invention include a circular shape, an elliptical shape, a triangular shape, and pentagonal or more polygonal shapes.

Regardless of the shape, the ratio p [%] of the distance d to the thickness t may be measured by the above-described method of observing the end portion, that is, the cut surface using SEM-EDS and performing elemental mapping on the forming material of the electrodes.

Figure 3:
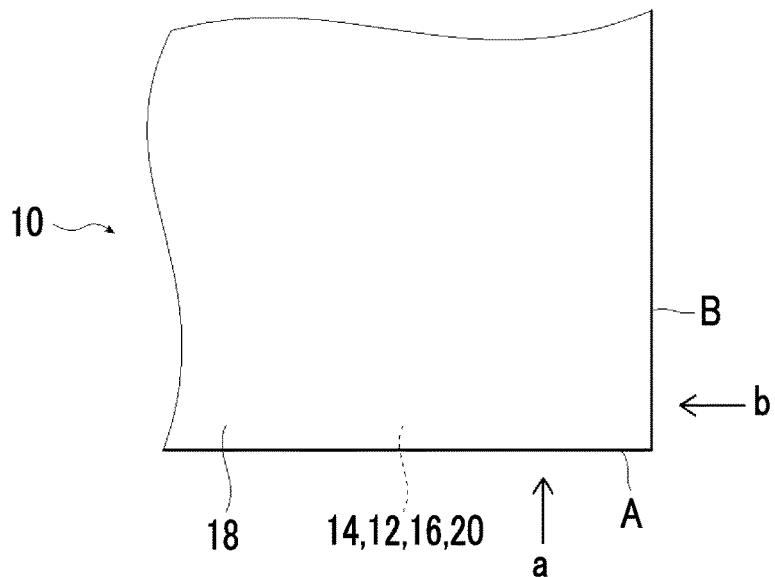
FIG. 3 is a conceptual view for describing a method of measuring the ratio of the distance between electrodes to the thickness of a piezoelectric layer in the piezoelectric film according to the embodiment of the present invention.

In the present invention, in a case where the piezoelectric film has a polygonal shape, the ratio p is measured in two directions as illustrated in FIG. 3 using all the corners as measurement targets, and the average value of all the ratios p (number of corners×two sites) is defined as the ratio p in the piezoelectric film 10. Further, the polygonal shape also includes a shape in which the corners are curved with a chamfer or the like. Further, in a case where the piezoelectric film has a shape such as a circular shape or an elliptical shape except for the polygonal shape, the ratio p is measured at eight sites where the outer circumference is equally divided, and the average value thereof is defined as the ratio p in the piezoelectric film 10.

Next, an example of the method of producing the piezoelectric film 10 according to the embodiment of the present invention will be described with reference to the conceptual views of FIGS. 4 to 8.

Figure 4:
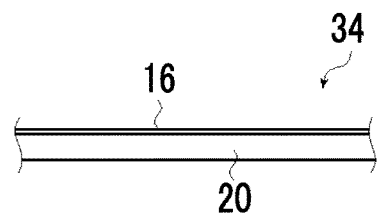
FIG. 4 is a conceptual view for describing an example of a method of producing the piezoelectric film according to the embodiment of the present invention.

First, as illustrated in FIG. 4, a sheet-like material 34 in which the second electrode layer 16 is formed on the surface of the second protective layer 20 is prepared. Further, as conceptually illustrated in FIG. 6, a sheet-like material 38 in which the first electrode layer 14 is formed on the surface of the first protective layer 18 is prepared.

The sheet-like material 34 may be prepared by forming a copper thin film or the like as the second electrode layer 16 on the surface of the second protective layer 20 using vacuum vapor deposition, sputtering, plating, or the like. Similarly, the sheet-like material 38 may be prepared by forming a copper thin film or the like as the first electrode layer 14 on the surface of the first protective layer 18 using vacuum vapor deposition, sputtering, plating, or the like.

Alternatively, a commercially available sheet-like material in which a copper thin film or the like is formed on a protective layer may be used as the sheet-like material 34 and/or the sheet-like material 38.

The sheet-like material 34 and the sheet-like material 38 may be exactly the same as or different from each other.

In a case where the protective layer is extremely thin and thus the handleability is degraded, a protective layer with a separator (temporary support) may be used as necessary. Further, a PET having a thickness of 25 μm to 100 μm or the like can be used as the separator. The separator may be removed after thermal compression bonding of the electrode layer and the protective layer.

Figure 5:
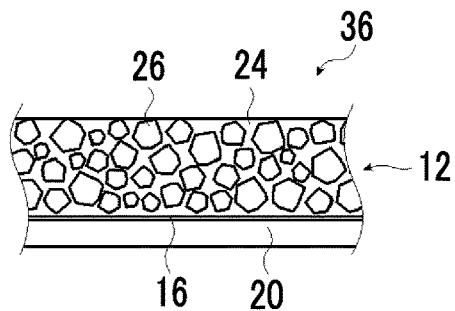
FIG. 5 is a conceptual view for describing an example of a method of producing the piezoelectric film according to the embodiment of the present invention.

Next, as illustrated in FIG. 5, the second electrode layer 16 of the sheet-like material 34 is coated with a paint (coating composition) forming the piezoelectric layer 12, and the paint is cured to form the piezoelectric layer 12. In this manner, the laminate 36 in which the sheet-like material 34 and the piezoelectric layer 12 are laminated is prepared.

The piezoelectric layer 12 can be formed by various methods depending on the material forming the piezoelectric layer 12.

As an example, first, a paint is prepared by dissolving the polymer material such as cyanoethylated PVA in an organic solvent, adding the piezoelectric particles 26 such as PZT particles thereto, and stirring the solution.

The organic solvent is not limited, and various organic solvents such as dimethylformamide (DMF), methyl ethyl ketone, and cyclohexanone can be used.

In a case where the sheet-like material 34 is prepared and the paint is prepared, the paint is cast (applied) onto the sheet-like material 34, and the organic solvent is evaporated and dried. In this manner, as illustrated in FIG. 5, the laminate 36 in which the second electrode layer 16 is provided on the second protective layer 20 and the piezoelectric layer 12 is laminated on the second electrode layer 16 is prepared.

A casting method of the paint is not limited, and all known methods (coating devices) such as a bar coater, a slide coater, and a doctor knife can be used.

Alternatively, in a case where the polymer material is a material that can be heated and melted, the laminate 36 illustrated in FIG. 5 may be prepared by heating and melting the polymer material to prepare a melt obtained by adding the piezoelectric particles 26 to the melted material, extruding the melt on the sheet-like material 34 illustrated in FIG. 4 in a sheet shape by carrying out extrusion molding or the like, and cooling the laminate.

As described above, in the piezoelectric layer 12, a polymer piezoelectric material such as PVDF may be added to the matrix 24 in addition to the polymer material having a viscoelasticity at room temperature.

In a case where the polymer piezoelectric material is added to the matrix 24, the polymer piezoelectric material to be added to the paint may be dissolved. Alternatively, the polymer piezoelectric material may be added to the heated and melted polymer material having a viscoelasticity at room temperature so that the polymer piezoelectric material is heated and melted.

A calender treatment may be performed after formation of the piezoelectric layer 12, as necessary. The calender treatment may be performed once or a plurality of times.

As is well known, the calender treatment is a treatment in which the surface to be treated is pressed while being heated by a heating press, a heating roller, or the like to flatten the surface.

Further, the piezoelectric layer 12 of the laminate 36 in which the second electrode layer 16 is provided on the second protective layer 20 and the piezoelectric layer 12 is formed on the second electrode layer 16 is subjected to the polarization treatment (poling). The polarization treatment of the piezoelectric layer 12 may be performed before the calender treatment, but it is preferable that the polarization treatment is performed after the calender treatment.

The method of performing a polarization treatment on the piezoelectric layer 12 is not limited, and a known method can be used. For example, electric field poling in which a DC electric field is directly applied to a target to be subjected to the polarization treatment is exemplified. Further, in a case of performing electric field poling, the electric field poling treatment may be performed using the first electrode layer 14 and the second electrode layer 16 by forming the first electrode layer 14 before the polarization treatment.

Further, in the piezoelectric film 10 according to the embodiment of the present invention, it is preferable that the polarization treatment is performed in the thickness direction of the piezoelectric layer 12 instead of the plane direction.

Figure 6:
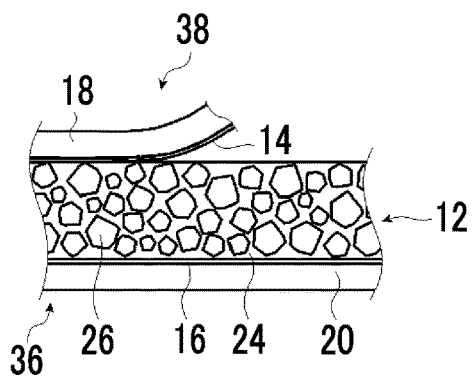
FIG. 6 is a conceptual view for describing an example of a method of producing the piezoelectric film according to the embodiment of the present invention.

Next, as illustrated in FIG. 6, the sheet-like material 38 that has been prepared in advance is laminated on the piezoelectric layer 12 side of the laminate 36 that has been subjected to the polarization treatment such that the first electrode layer 14 is directed toward the piezoelectric layer 12.

Figure 7:
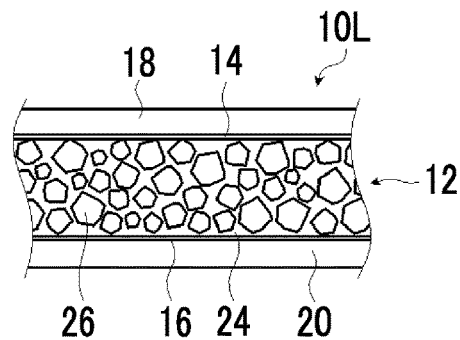
FIG. 7 is a conceptual view for describing an example of a method of producing the piezoelectric film according to the embodiment of the present invention.

Further, a large-sized (long) piezoelectric film 10L as illustrated in FIG. 7 is prepared by performing thermal compression bonding on the laminate using a heating press device, heating rollers, or the like such that the first protective layer 18 and the second protective layer 20 are sandwiched and bonding the laminate 36 and the sheet-like material 38 to each other.

Alternatively, the piezoelectric film 10L may be prepared by bonding or preferably further compression-bonding the laminate 36 and the sheet-like material 38 to each other using an adhesive.

Further, the piezoelectric film 10L may be produced using the cut sheet-like material 34 and the cut sheet-like material 38 or preferably using roll-to-roll.

Figure 8:
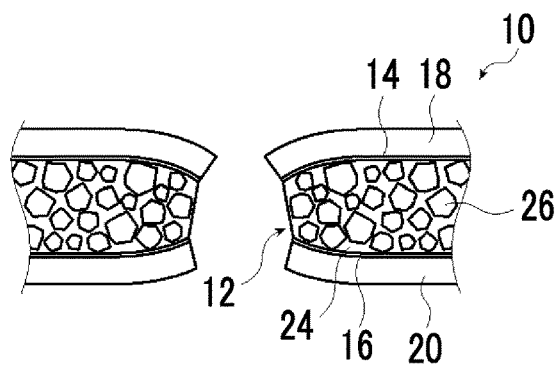
FIG. 8 is a conceptual view for describing an example of a method of producing the piezoelectric film according to the embodiment of the present invention.

Finally, as conceptually illustrated in FIG. 8, the prepared large-sized piezoelectric film 10L is cut into a predetermined shape, for example, a rectangular shape using a cutting unit such as a cutter blade or a punching mold to obtain the cut sheet-like piezoelectric film 10.

The piezoelectric film 10 to be prepared in the above-described manner is polarized in the thickness direction instead of the plane direction, and thus excellent piezoelectric characteristics are obtained even in a case where the stretching treatment is not performed after the polarization treatment. Therefore, the piezoelectric film 10 has no in-plane anisotropy as a piezoelectric characteristic, and stretches and contracts isotropically in all directions in the plane direction in a case where a driving voltage is applied.

Figure 9:
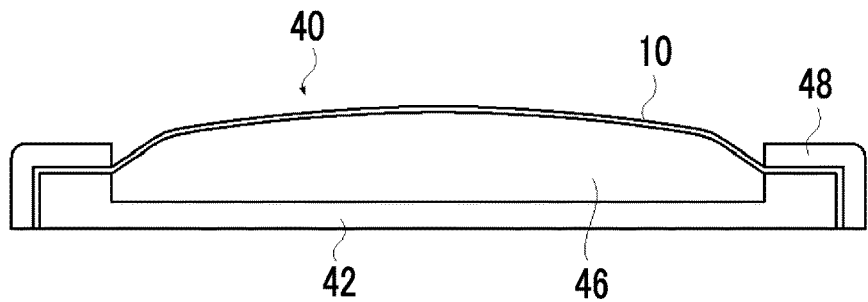
FIG. 9 is a conceptual view illustrating an example of a flat speaker formed of the piezoelectric film according to the embodiment of the present invention.

FIG. 9 is a conceptual view illustrating an example of a flat plate type piezoelectric speaker formed of the piezoelectric film 10 according to the embodiment of the present invention.

The piezoelectric speaker 40 is a flat plate type piezoelectric speaker that uses the piezoelectric film 10 as a vibration plate that converts an electric signal into vibration energy. Further, the piezoelectric speaker 40 can also be used as a microphone, a sensor, or the like.

The piezoelectric speaker 40 is configured to have the piezoelectric film 10, a case 42, a viscoelastic support 46, and a frame 48.

The case 42 is a thin housing formed of plastic or the like and having one surface that is open. Examples of the shape of the housing include a rectangular parallelepiped shape, a cubic shape, and a cylindrical shape.

Further, the frame 48 is a frame material that has, in the center thereof, a through hole having the same shape as the open surface of the case 42 and engages with the open surface side of the case 42.

The viscoelastic support 46 is a support used for efficiently converting the stretch and contraction movement of the piezoelectric film 10 into a forward and rearward movement (a movement in the direction perpendicular to the surface of the film) by means of having moderate viscosity and elasticity, supporting the piezoelectric film 10, and applying a constant mechanical bias to any place of the piezoelectric film. Examples of the viscoelastic support 46 include nonwoven fabric such as wool felt or wood felt containing PET and glass wool.

The piezoelectric speaker 40 is configured by accommodating the viscoelastic support 46 in the case 42, covering the case 42 and the viscoelastic support 46 with the piezoelectric film 10, and fixing the frame 48 to the case 42 in a state of pressing the periphery of the piezoelectric film 10 against the upper end surface of the case 42 by the frame 48.

Here, in the piezoelectric speaker 40, the viscoelastic support 46 has a shape in which the height (thickness) is larger than the height of the inner surface of the case 42.

Therefore, in the piezoelectric speaker 40, the viscoelastic support 46 is held in a state of being thinned by being pressed downward by the piezoelectric film 10 at the peripheral portion of the viscoelastic support 46. Similarly, in the peripheral portion of the viscoelastic support 46, the curvature of the piezoelectric film 10 suddenly fluctuates, and a rising portion that decreases in height toward the periphery of the viscoelastic support 46 is formed in the piezoelectric film 10. Further, the central region of the piezoelectric film 10 is pressed by the viscoelastic support 46 having a square columnar shape and has a (approximately) planar shape.

In the piezoelectric speaker 40, in a case where the piezoelectric film 10 is stretched in the plane direction due to the application of a driving voltage to the first electrode layer 14 and the second electrode layer 16, the rising portion of the piezoelectric film 10 changes the angle in a rising direction due to the action of the viscoelastic support 46 in order to absorb the stretched part. As a result, the piezoelectric film 10 having the planar portion moves upward.

On the contrary, in a case where the piezoelectric film 10 contracts in the plane direction due to the application of the driving voltage to the first electrode layer 14 and the second electrode layer 16, the rising portion of the piezoelectric film 10 changes the angle in a falling direction (a direction approaching the flat surface) in order to absorb the contracted part.

As a result, the piezoelectric film 10 having the planar portion moves downward.

The piezoelectric speaker 40 generates a sound by the vibration of the piezoelectric film 10.

In the piezoelectric film 10, the conversion from the stretching and contracting movement to vibration can also be achieved by holding the piezoelectric film 10 in a curved state.

Therefore, the piezoelectric film 10 can function as a piezoelectric speaker having flexibility by being simply held in a curved state instead of the piezoelectric speaker 40 having rigidity in a flat plate shape, as illustrated in FIG. 9.

The piezoelectric speaker formed of the piezoelectric film 10 can be stored in a bag or the like by, for example, being rolled or folded using the excellent flexibility. Therefore, according to the piezoelectric film 10, a piezoelectric speaker that can be easily carried even in a case where the piezoelectric speaker has a certain size can be realized.

Further, as described above, the piezoelectric film 10 has excellent softness and excellent flexibility, and has no in-plane anisotropy as a piezoelectric characteristic. Therefore, in the piezoelectric film 10, a change in acoustic quality regardless of the direction in which the film is bent is small, and a change in acoustic quality with respect to the change in curvature is also small. Accordingly, the piezoelectric speaker formed of the piezoelectric film 10 has a high degree of freedom of the installation place and can be attached to various products as described above. For example, a so-called wearable speaker can be realized by attaching the piezoelectric film 10 to clothing such as a suit and portable items such as a bag in a curved state.

Further, as described above, the piezoelectric film according to the embodiment of the present invention can be used for a speaker of a display device by bonding the piezoelectric film to a display device having flexibility such as an organic EL display device having flexibility or a liquid crystal display device having flexibility.

As described above, the piezoelectric film 10 stretches and contracts in the plane direction in a case where a voltage is applied, and vibrates suitably in the thickness direction due to the stretch and contraction in the plane direction, and thus an excellent acoustic characteristic in which a sound with a high sound pressure can be output in a case where the piezoelectric film 10 is used for a piezoelectric speaker or the like is exhibited.

The piezoelectric film 10, which exhibits excellent acoustic characteristics, that is, high stretch and contraction performance due to piezoelectricity is satisfactorily operated as a piezoelectric vibrating element that vibrates a vibration body such as a vibration plate by laminating a plurality of the piezoelectric films.

Further, in a case of lamination of the piezoelectric films 10, each piezoelectric film may not have the first protective layer 18 and/or the second protective layer 20 unless there is a possibility of a short circuit. Alternatively, the piezoelectric films that do not have the first protective layer 18 and/or the second protective layer 20 may be laminated through an insulating layer.

As an example, a speaker in which a laminate of the piezoelectric films 10 is bonded to the vibration plate and the vibration plate is vibrated by the laminate of the piezoelectric films 10 to output a sound may be used. That is, in this case, the laminate of the piezoelectric film 10 acts as a so-called exciter that outputs a sound by vibrating the vibration plate.

By applying a driving voltage to the laminated piezoelectric films 10, each piezoelectric film 10 stretches and contracts in the plane direction, and the entire laminate of the piezoelectric film 10 stretches and contracts in the plane direction due to the stretch and contraction of each piezoelectric film 10. The vibration plate to which the laminate has been bonded is bent due to the stretch and contraction of the laminate of the piezoelectric film 10 in the plane direction, and thus the vibration plate vibrates in the thickness direction. The vibration plate generates a sound using the vibration in the thickness direction. The vibration plate vibrates according to the magnitude of the driving voltage applied to the piezoelectric film 10 and generates a sound according to the driving voltage applied to the piezoelectric film 10.

Therefore, the piezoelectric film 10 itself does not output sound in this case.

Even in a case where the rigidity of each piezoelectric film 10 is low and the stretching and contracting force thereof is small, the rigidity is increased by laminating the piezoelectric films 10, and the stretching and contracting force as the entire laminate is increased. As a result, in the laminate of the piezoelectric films 10, even in a case where the vibration plate has a certain degree of rigidity, the vibration plate is sufficiently bent with a large force and the vibration plate can be sufficiently vibrated in the thickness direction, whereby the vibration plate can generate a sound.

In the laminate of the piezoelectric film 10, the number of laminated piezoelectric films 10 is not limited, and the number of sheets set such that a sufficient amount of vibration is obtained may be appropriately set according to, for example, the rigidity of the vibration plate to be vibrated.

Further, one piezoelectric film 10 can also be used as a similar exciter (piezoelectric vibrating element) in a case where the piezoelectric film has a sufficient stretching and contracting force.

The vibration plate vibrated by the laminate of the piezoelectric film 10 is not limited, and various sheet-like materials (such as plate-like materials and films) can be used.

Examples thereof include a resin film consisting of polyethylene terephthalate (PET) and the like, foamed plastic consisting of foamed polystyrene and the like, a paper material such as a corrugated cardboard material, a glass plate, and wood. Further, a device such as a display device may be used as the vibration plate in a case where the device can be sufficiently bent.

It is preferable that the laminate of the piezoelectric film 10 is obtained by bonding adjacent piezoelectric films with a bonding layer (bonding agent). Further, it is preferable that the laminate of the piezoelectric film 10 and the vibration plate are also bonded to each other with a bonding layer.

The bonding layer is not limited, and various layers that can bond materials to be bonded can be used. Therefore, the bonding layer may consist of a pressure sensitive adhesive or an adhesive. It is preferable that an adhesive layer consisting of an adhesive is used from the viewpoint that a solid and hard bonding layer is obtained after the bonding.

The same applies to the laminate formed by folding back the long piezoelectric film 10 described later.

In the laminate of the piezoelectric films 10, the polarization direction of each piezoelectric film 10 to be laminated is not limited. As described above, the polarization direction of the piezoelectric film 10 is the polarization direction in the thickness direction.

Therefore, in the laminate of the piezoelectric films 10, the polarization directions may be the same for all the piezoelectric films 10, and piezoelectric films having different polarization directions may be present.

Here, in the laminate of the piezoelectric films 10, it is preferable that the piezoelectric films 10 are laminated such that the polarization directions of the adjacent piezoelectric films 10 are opposite to each other.

In the piezoelectric film 10, the polarity of the voltage to be applied to the piezoelectric layer 12 depends on the polarization direction of the piezoelectric layer 12. Therefore, even in a case where the polarization direction is directed from the first electrode layer 14 toward the second electrode layer 16 or from the second electrode layer 16 toward the first electrode layer 14, the polarity of the first electrode layer 14 and the polarity of the second electrode layer 16 in all the piezoelectric films 10 to be laminated are set to be the same as each other.

Therefore, by reversing the polarization directions of the adjacent piezoelectric films 10, even in a case where the electrode layers of the adjacent piezoelectric films 10 come into contact with each other, the polarities of the electrode layers in contact with each other are the same as each other, and thus there is no risk of a short circuit.

The laminate of the piezoelectric film 10 may be configured such that a long piezoelectric film 10 is folded back, for example, once or more times, or preferably a plurality of times to laminate a plurality of layers of the piezoelectric films 10.

The structure in which the long piezoelectric film 10 is folded back and laminated has the following advantages.

That is, in the laminate in which a plurality of cut sheet-like piezoelectric films 10 are laminated, the first electrode layer 14 and the second electrode layer 16 need to be connected to a driving power supply for each piezoelectric film. On the contrary, in the configuration in which the long piezoelectric film 10 is folded back and laminated, only one sheet of the long piezoelectric film 10 can form the laminate. Further, in the configuration in which the long piezoelectric film 10 is folded back and laminated, only one power supply is required for applying the driving voltage, and the electrode may be pulled out from the piezoelectric film 10 at one place.

Further, in the configuration in which the long piezoelectric film 10 is folded back and laminated, the polarization directions of the adjacent piezoelectric films 10 are inevitably opposite to each other.

Hereinbefore, the piezoelectric film according to the embodiment of the present invention has been described in detail, but the present invention is not limited to the above-described examples, and various improvements or modifications may be made within a range not departing from the scope of the present invention.

EXAMPLES

Hereinafter, the present invention will be described in more detail with reference to specific examples of the present invention. Further, the present invention is not limited to the examples, and the materials, the used amounts, the proportions, the treatment contents, the treatment procedures, and the like shown in the following examples can be appropriately changed within a range not departing from the scope of the present invention.

Preparation of Piezoelectric Film

A large-sized piezoelectric film was prepared by the method illustrated in FIGS. 4 to 7.

First, cyanoethylated PVA (CR-V, manufactured by Shin-Etsu Chemical Co., Ltd.) was dissolved in dimethylformamide (DMF) at the following compositional ratio. Thereafter, PZT particles serving as the piezoelectric particles were added to the solution at the following compositional ratio, and the solution was stirred using a propeller mixer (rotation speed of 2000 rpm), thereby preparing a paint for forming a piezoelectric layer.

PZT Particles: 300 parts by mass
Cyanoethylated PVA: 30 parts by mass
DMF: 70 parts by mass Further, PZT particles obtained by sintering mixed powder, formed by wet-mixing powder of a Pb oxide, a Zr oxide, and a Ti oxide as the main components such that the amount of Zr and the amount of Ti respectively reached 0.52 moles and 0.48 moles with respect to 1 mole of Pb using a ball mill, at 800° C. for 5 hours and being subjected to a crushing treatment were used as the PZT particles.

Further, a sheet-like material obtained by performing vacuum vapor deposition on a copper thin film having a thickness of 0.1 μm was prepared on a PET film having a thickness of 4 μm. That is, in the present example, the first electrode layer and the second electrode layer are copper vapor deposition thin films having a thickness of 0.1 μm, and the first protective layer and the second protective layer are PET films having a thickness of 4 μm.

The second electrode layer (copper vapor deposition thin film) of the sheet-like material was coated with a paint for forming the piezoelectric layer prepared in advance using a slide coater. Further, the second electrode layer was coated the paint such that the film thickness of the coating film after being dried reached 40 μm.

Next, the material obtained by coating the sheet-like material with the paint was heated and dried on a hot plate at 120° C. to evaporate DMF. In this manner, a laminate in which the second electrode layer made of copper was provided on the second protective layer made of PET and the piezoelectric layer (polymer-based piezoelectric composite material layer) having a thickness of 30 μm was formed thereon was prepared.

The prepared piezoelectric layer was subjected to a polarization treatment in the thickness direction.

A sheet-like material obtained by depositing a copper thin film on the PET film was laminated on the laminate that had been subjected to a polarization treatment such that the first electrode layer (copper thin film side) was directed toward the piezoelectric layer.

Next, a large-sized piezoelectric film as illustrated in FIG. 7 was prepared by performing thermal compression bonding on the laminate of the laminate and the sheet-like material at a temperature of 120° C. using a laminator device, and bonding and adhering the piezoelectric composite material and the first electrode layer to each other.

In the large-sized piezoelectric film, a piezoelectric film having a piezoelectric layer with a thickness of 60 μm and a piezoelectric film having a piezoelectric layer with a thickness of 140 μm were also prepared in addition to the piezoelectric film having a piezoelectric layer with a thickness of 30 μm, by changing the coating thickness of the paint for forming the piezoelectric layer.

Examples 1 to 9 and Comparative Examples 1 to 4

Each of the prepared piezoelectric films was cut into a size of 210×300 mm by changing the cutter blade and the mold to be used in various ways to prepare a cut sheet-like piezoelectric film.

The distance d between the first electrode layer and the second electrode layer at the end portion in the thickness direction and the thickness t of the piezoelectric layer were measured by the above-described method using SEM-EDS for each of the prepared piezoelectric films, and the ratio p [%] of the distance d to the thickness t was calculated. In the measurement performed using SEM-EDS, SU8220 (manufactured by Hitachi High-Tech Corporation) was used as a SEM and XFash 5060FQ (manufactured by Bruker Corporation) was used as an EDS.

A piezoelectric speaker as illustrated in FIG. 9 was prepared by placing the prepared piezoelectric film on a 210×300 mm case in which glass wool serving as a viscoelastic support was stored in advance as illustrated in FIG. 9 and pressing the peripheral portion with a frame to impart an appropriate tension and an appropriate curvature to the piezoelectric film.

The depth of the case was set to 9 mm, the density of glass wool was set to 32 kg/m³, and the thickness before assembly was set to 25 mm.

Figure 10:
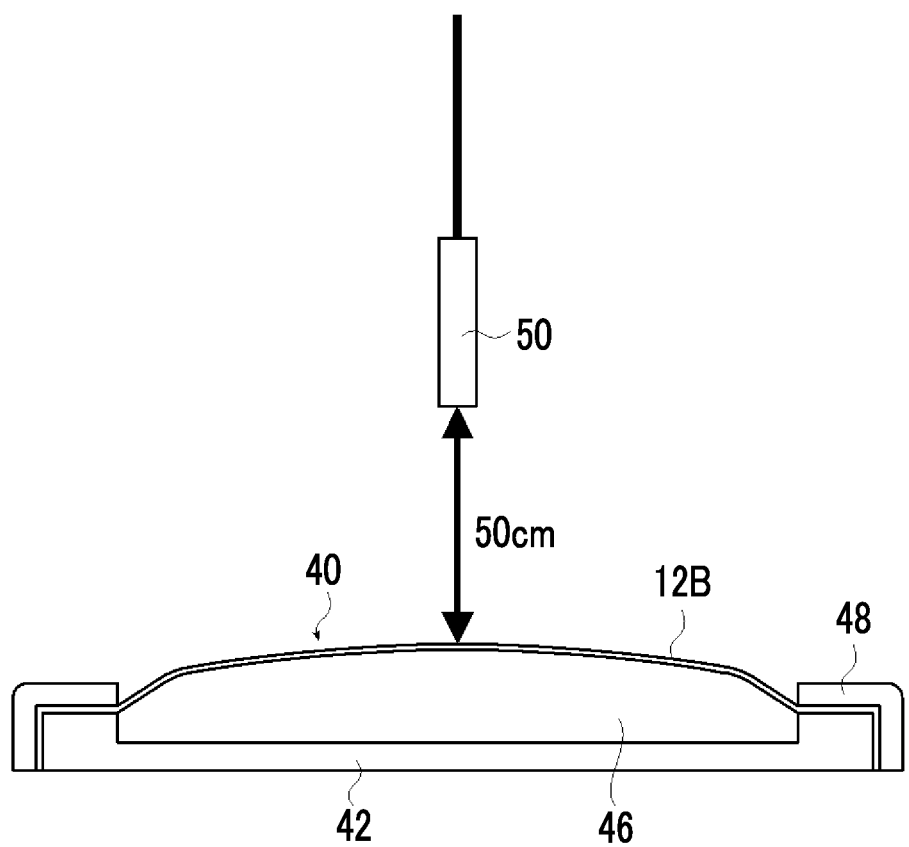
FIG. 10 is a conceptual view for describing a measuring method in an example.

The prepared piezoelectric speaker was placed in an anechoic chamber, 50 V and 100 V sine waves with a frequency of 100 Hz were input as an input signal through a power amplifier, and the sound was recorded with a microphone 50 placed at a distance of 50 cm from the center of the speaker as illustrated in FIG. 10.

The following evaluation was performed based on the recorded data.
- A: A sound was produced without any problem
- B: A sound was produced after a discharge sound.
- C: No sound was produced (overcurrent flew through the power amplifier and tripped)

The results are listed in the table below.

The piezoelectric film can be suitably applied to speakers, microphones, and the like.

EXPLANATION OF REFERENCES

- 10, 10L: piezoelectric film
- 12: piezoelectric layer
- 14: first electrode layer
- 16: second electrode layer
- 18: first protective layer
- 20: second protective layer
- 24: polymer matrix
- 26: piezoelectric particle
- 34, 38: sheet-like material
- 36: laminate
- 40: piezoelectric speaker

TABLE 1

| | Thickness of piezoelectric layer [μm] | Ratio p [%] | Evaluation Applied voltage [V] 50 | Evaluation Applied voltage [V] 100 | Remarks Cutting condition |
|---|---|---|---|---|---|
| Example 1 | 30 | 94.5 | A | A | Carbide cutter blade: new blade |
| Example 2 | 30 | 63 | A | A | Punching with mold: after polishing |
| Example 3 | 30 | 44.3 | A | A | Punching with mold: after 70000 short circuits |
| Example 4 | 30 | 40.4 | A | B | Punching with mold: after 100000 short circuits |
| Comparative Example 1 | 30 | 38.2 | C | — | Carbide cutter blade: after using 7 km |
| Comparative Example 2 | 30 | 21 | C | — | Carbide cutter blade: after using 10 km |
| Example 5 | 60 | 91.2 | A | A | Carbide cutter blade: new blade |
| Example 6 | 60 | 54 | A | A | Punching with mold: after 100000 short circuits |
| Comparative Example 3 | 60 | 37 | C | — | Carbide cutter blade: after using 7 km |
| Example 7 | 140 | 88.7 | A | A | Carbide cutter blade: new blade |
| Example 8 | 140 | 49.2 | A | A | Punching with mold: after 100000 short circuits |
| Example 9 | 140 | 40.3 | B | B | Carbide cutter blade: after using 7 km |
| Comparative Example 4 | 140 | 28 | C | — | Carbide cutter blade: after using 10 km |

As listed in the table, in the piezoelectric film according to the embodiment of the present invention in which the ratio p of the distance d between the first electrode layer and the second electrode layer at the end portion in the thickness direction to the thickness t of the piezoelectric layer was 40% or greater, a sound was able to be output properly without occurrence of a short circuit in a case where the piezoelectric film was used for a speaker. Further, in the piezoelectric film evaluated as B, a discharge sound was produced because the insulating properties between the electrodes on the end surface, that is, the cut surface were slightly degraded and discharge occurred at the same time as energization. Thereafter, the insulating properties between the electrodes were sufficiently ensured and a sound was output without any problem.

On the contrary, in each comparative example in which the ratio p was less than 40%, it was considered that no sound was produced because the insulating properties between the electrodes on the end surface, that is, the cut surface were insufficient and a short circuit occurred.

As shown in the results described above, the effects of the present invention are apparent.

- 42: case
- 46: viscoelastic support
- 48: frame
- 50: microphone

What is claimed is:

1. A cut sheet-like piezoelectric film comprising:
   a piezoelectric layer which contains piezoelectric particles in a matrix containing a polymer material; and
   electrode layers which are provided on both surfaces of the piezoelectric layer,
   wherein at an end portion, which comprises a cut surface of the cut sheet-like piezoelectric film and is plastically deformed due to cutting, a distance between the electrode layers in a thickness direction is 40% or greater with respect to a thickness of the piezoelectric layer.

2. The piezoelectric film according to claim 1, further comprising:
   a protective layer which covers at least one electrode layer.

3. The piezoelectric film according to claim 1,
   wherein the distance between the electrode layers at the end portion in the thickness direction is 95% or less with respect to the thickness of the piezoelectric layer.

4. The piezoelectric film according to claim 1,
wherein the polymer material contains a cyanoethyl group.

5. The piezoelectric film according to claim 4,
wherein the polymer material is cyanoethylated polyvinyl alcohol.

6. The piezoelectric film according to claim 2,
wherein the distance between the electrode layers at the end portion in the thickness direction is 95% or less with respect to the thickness of the piezoelectric layer.

7. The piezoelectric film according to claim 2,
wherein the polymer material contains a cyanoethyl group.

8. The piezoelectric film according to claim 3,
wherein the polymer material contains a cyanoethyl group.

* * * * *